(12) United States Patent
Leobandung et al.

(10) Patent No.: US 9,548,421 B2
(45) Date of Patent: Jan. 17, 2017

(54) OPTOELECTRONIC DEVICES WITH BACK CONTACT

(71) Applicant: INTERNATIONAL BUSINESS MACHINES CORPORATION, Armonk, NY (US)

(72) Inventors: Effendi Leobandung, Stormville, NY (US); Ning Li, White Plains, NY (US); Tak H. Ning, Yorktown Heights, NY (US); Jean-Olivier Plouchart, New York, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/676,337

(22) Filed: Apr. 1, 2015

(65) Prior Publication Data
US 2016/0293801 A1 Oct. 6, 2016

(51) Int. Cl.
*H01L 33/00* (2010.01)
*H01L 29/40* (2006.01)
(Continued)

(52) U.S. Cl.
CPC ......... *H01L 33/38* (2013.01); *H01L 31/02005* (2013.01); *H01L 31/022408* (2013.01);
(Continued)

(58) Field of Classification Search
CPC ........ H01L 33/36; H01L 33/38; H01L 33/387; H01L 33/44; H01L 33/62; H01L 31/02002; H01L 31/02005; H01L 31/02008; H01L 31/0224; H01L 31/022408; H01L 31/022425; H01L 2933/0016; H01L 2933/0066; H01L 2924/12042; H01L 2924/12041
(Continued)

(56) References Cited

U.S. PATENT DOCUMENTS 5,057,894 A * 10/1991 Ikeda ................ H01L 21/28525
257/370
5,405,453 A 4/1995 Ho et al.
(Continued)

FOREIGN PATENT DOCUMENTS

| GB | 2 242 783 A | 10/1991 |
|---|---|---|
| WO | 03/065463 A2 | 8/2003 |
| WO | 2013/164659 A1 | 11/2013 |

OTHER PUBLICATIONS

Notice of Allowance dated Mar. 23, 2016 received in U.S. Appl. No. 14/749,067.
U.S. Appl. No. 14/661,037, filed Mar. 18, 2015.

*Primary Examiner* — Fernando L Toledo
*Assistant Examiner* — Aaron Gray
(74) *Attorney, Agent, or Firm* — Scully, Scott, Murphy & Presser, P.C.; Louis J. Percello, Esq.

(57) ABSTRACT

A semiconductor structure includes an optoelectronic device located in one region of a substrate. A dielectric material is located adjacent and atop the optoelectronic device. A top contact is located within a region of the dielectric material and contacting a topmost surface of the optoelectronic device. A bottom metal contact is located beneath the optoelectronic device and lining a pair of openings located with other regions of the dielectric material, wherein a portion of the bottom metal contact contacts an entire bottommost surface of the optoelectronic device.

12 Claims, 8 Drawing Sheets

(51) Int. Cl.
*H01L 21/00* (2006.01)
*H01L 33/38* (2010.01)
*H01L 33/62* (2010.01)
*H01L 31/0224* (2006.01)
*H01L 31/02* (2006.01)
*H01L 31/18* (2006.01)
*H01L 33/36* (2010.01)

(52) U.S. Cl.
CPC .............. *H01L 31/18* (2013.01); *H01L 33/36* (2013.01); *H01L 33/62* (2013.01); *H01L 2933/0016* (2013.01); *H01L 2933/0066* (2013.01)

(58) Field of Classification Search
USPC ....... 257/98, 99, 100, 621, E33.056; 438/26, 438/27, 28
See application file for complete search history.

(56) References Cited

U.S. PATENT DOCUMENTS

| | | |
|---|---|---|
| 6,815,736 B2 | 11/2004 | Mascarenhas |
| 8,236,583 B2 | 8/2012 | Chen et al. |
| 8,247,260 B2 | 8/2012 | Sivaram et al. |
| 8,343,856 B2 | 1/2013 | Therrien et al. |
| 8,350,288 B2 | 1/2013 | Therrien et al. |
| 8,647,895 B1 | 2/2014 | Yang |
| 9,134,494 B2 | 9/2015 | Wang et al. |
| 2005/0224908 A1* | 10/2005 | Barth .................. H01L 23/5223 257/528 |
| 2010/0029039 A1 | 2/2010 | Shan et al. |
| 2012/0286240 A1* | 11/2012 | Yu ....................... H01L 25/0753 257/13 |
| 2013/0015499 A1 | 1/2013 | Briere |
| 2014/0367722 A1* | 12/2014 | Im .......................... H01L 33/20 257/98 |

* cited by examiner

OPTOELECTRONIC DEVICES WITH BACK CONTACT

BACKGROUND

The present application relates to a semiconductor structure and a method of forming the same. More particularly, the present application relates to a semiconductor structure including at least one optoelectronic device containing a back contact. The present application also provides a method of forming such a structure.

As microelectronic systems continue to scale down, the resultant electrical density would have to accommodate increased power dissipation, signal delay and cross-talk, while running at extremely high clock speeds. Current trends indicate that in less than a decade the power consumed by interconnects might become the limiting factor in determining the switching speeds in integrated circuits. To overcome these problems, the integration of optical interconnects and systems alongside conventional silicon based microelectronic circuits would be a major step forward. Light base intra- and inter-chip communication would diminish latency considerably and reduce power consumption by eliminating capacitive interconnect loss. Improved optoelectronic integration can also help increase the speed of transceiver circuits used in optical communication systems, thereby increasing the overall band width.

Optoelectronic devices such as III-V optoelectronic devices, integrated in silicon typically use top contacts or side contacts due to the ease of processing only the top surface of the silicon substrate. Despite the ease of formation, top contacts to optoelectronic devices do not offer the same advantages that back contacts to optoelectronic devices do. For example, back contacts to optoelectronic devices can provide uniform current injection, better heat sinking, low series resistance and/or a bottom mirror for light reflection.

In view of the above, there is a need to provide optoelectronic devices integrated on a same chip with conventional CMOS devices in which a back contact is formed to each optoelectronic device.

SUMMARY

In one aspect of the present application, a semiconductor structure is provided. In one embodiment, the semiconductor structure includes an optoelectronic device located in one region of a substrate. A dielectric material is located adjacent and atop the optoelectronic device. A top contact is located within a region of the dielectric material and contacting a topmost surface of the optoelectronic device. A bottom metal contact is located beneath the optoelectronic device and lining a pair of openings located with other regions of the dielectric material, wherein a portion of the bottom metal contact contacts an entire bottommost surface of the optoelectronic device.

In another aspect of the present application, a method of forming a semiconductor structure is provided. In one embodiment of the present application, the method includes providing an optoelectronic device embedded within a dielectric material, wherein the optoelectronic device is located on a silicon layer or a germanium layer and in one region of a substrate, wherein an insulator layer separates the silicon layer or the germanium layer from the substrate in the first region. A pair of openings is subsequently formed within the dielectric material and between the optoelectronic device, each opening extends to a surface of the silicon layer or the germanium layer. Next, the silicon layer or the germanium layer that is located beneath the optoelectronic device is removed to form an air gap. A bottom metal contact is then formed in the air gap and lining the pair of openings, wherein a portion of the bottom metal contact contacts an entire bottommost surface of the optoelectronic device.

In another embodiment of the present application, the method includes providing an optoelectronic device embedded within a dielectric material, wherein the optoelectronic device is located on a bulk semiconductor substrate. A pair of openings is subsequently formed within the dielectric material and between the optoelectronic device, each opening extends to a surface of bulk semiconductor substrate. An upper portion of the bulk semiconductor substrate that is located beneath the optoelectronic device is then removed to form an air gap. Next, a bottom metal contact is formed in the air gap and lining the pair of openings, wherein a portion of the bottom metal contact contacts an entire bottommost surface of the optoelectronic device.

DETAILED DESCRIPTION

Figure 1:
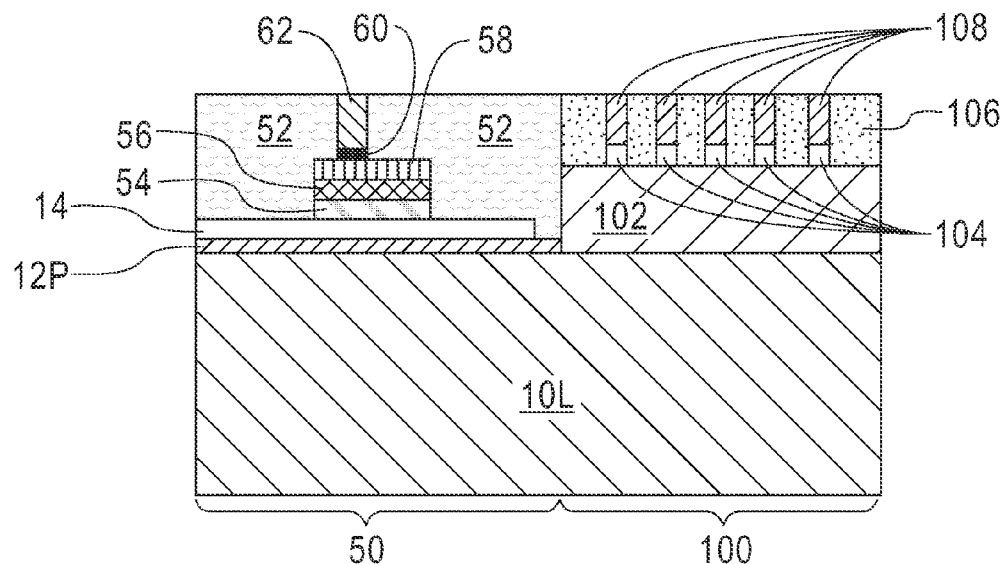
FIG. 1 is a cross sectional view of an exemplary semiconductor structure including an optoelectronic device located on a germanium layer and in a first region of a substrate, and complementary metal oxide semiconductor (CMOS) devices located on an epitaxtially grown semiconductor material layer and in a second region of the substrate, wherein a top contact is made to the optoelectronic device and each CMOS device.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including an optoelectronic device (54, 56, 58) located on a germanium layer 14 and in a first region 50 of a substrate 10L, and complementary metal oxide semiconductor (CMOS) devices 104 located on an epitaxtially grown semiconductor material layer 102 and in a second region 100 of the substrate 10L, wherein a top contact (62, 108) is made to the optoelectronic device (54, 56, 58) and each CMOS device 104. Although a single optoelectronic device is described and illustrated, a plurality of optoelectronic devices can be formed on the germanium layer 14. In one embodiment and when a plurality of optoelectronic devices is formed, each optoelectronic device can be the same type of optoelectronic device. In another embodiment, and when a plurality of optoelectronic devices are formed, a first set of optoelectronic devices can be of a first type, and a second set of optoelectronic devices can be of a second type, which differs from the first type.

In accordance with the present embodiment, substrate 10L is a handle substrate of a germanium-on-insulator (GOI) substrate. The substrate 10L may comprise any semiconductor material including, for example, silicon (Si), germanium (Ge), a silicon germanium (SiGe) alloy, SiGeC, SiC, an III-V compound semiconductor or an II-VI compound semiconductor. Multilayers of these semiconductor materials can also be used as the semiconductor material of substrate 10L.

The substrate 10L may have any crystal orientation including, for example, {100}, {110} or {111}. In some embodiments, the substrate 10L may be a single crystalline semiconductor material. Typically, and in one embodiment of the present application, the substrate 10L is single crystal silicon. In other embodiments, the substrate 10L is a polycrystalline semiconductor material such as, for example, polycrystalline silicon.

Within the first region 50, an insulator layer portion 12P is present directly on a topmost surface of the substrate 10L. The insulator layer portion 12P is a remaining portion of an insulator layer of the GOI substrate mentioned above. The insulator layer portion 12P comprises a crystalline dielectric material or a non-crystalline dielectric material. In one embodiment, the insulator layer portion 12P may comprise silicon dioxide. In another embodiment, the insulator layer portion 12P may comprise silicon nitride or boron nitride. In yet another embodiment, the insulator layer portion 12P may comprise, in any order, silicon dioxide and one of silicon nitride or boron nitride. In one embodiment, the insulator layer portion 12P can have a thickness from 1 nm to 200 nm. Other thicknesses that are lesser than, or greater than, the aforementioned thickness range can also be used as the thickness of the insulator layer portion 12P.

Also within the first region 50 of the substrate 10L is a germanium layer 14 which is present directly on a topmost surface of insulator layer portion 12P. The germanium layer 14 represents a remaining portion of the germanium layer of the GOI substrate mentioned above. In one embodiment, the germanium layer 14 comprises pure germanium. In one embodiment, the germanium layer 14 can have a thickness from 10 nm to 100 nm. Other thicknesses that are lesser than, or greater than, the aforementioned thickness range can also be used as the thickness of the germanium layer 14.

The first region 50 further includes an optoelectronic device (54, 56, 58) located on a portion of the germanium layer 14. The optoelectronic device may include, for example, an optoelectronic transmitting device, such as a laser, an optoelectronic receiving device such as, for example, a detector, or any combination of these or other optoelectronic devices. In one embodiment, and as illustrated in the present application, the optoelectronic device comprises, from bottom to top, a bottom cladding layer 54, an active region 56, and a top cladding layer 58. In some embodiments, and as illustrated, the bottom cladding layer 54, the active layer 56, and the top cladding layer 58 have sidewall edges (i.e., surfaces) that are vertically aligned with each other.

The bottom cladding layer 54 may comprise any semiconductor material including, for example, an IV semiconductor material and/or an III-V compound semiconductor material. In one example, the bottom cladding layer 54 may comprise AlGaAs. The semiconductor material that provides the bottom cladding layer 54 may be of a first conductivity type (n-type or p-type). The semiconductor material that provides the bottom cladding layer 54 can be formed utilizing an epitaxial growth (or deposition) process. Since an epitaxial growth process is used in forming the semiconductor material that provides the bottom cladding layer 54, the bottom cladding layer 54 has an epitaxial relationship, i.e., same crystal orientation, as the topmost surface of the germanium layer 14.

The active layer 56 may include any semiconductor material including, for example, an IV semiconductor material and/or an III-V compound semiconductor material. In one example, the active layer 56 may comprise GaAs. In one embodiment, the active layer 56 comprises a semiconductor material that has a same lattice constant as the underlying bottom cladding layer 54. In yet another embodiment, the active layer 56 comprises a semiconductor material that has a lower band gap than the semiconductor material that provides the bottom cladding layer 54. In some embodiments (not shown), the active layer 56 may be in contact with sidewall edges of a wave guide that is formed laterally adjacent the active layer 56. The active layer 56 is typically non-doped or has a lower dopant concentration than either the bottom cladding layer 54 or the top cladding layer 58. The semiconductor material that provides the active layer 56 can be formed utilizing an epitaxial growth (or deposition) process. Since an epitaxial growth process is used in forming the semiconductor material that provides the active layer 56, the active layer 56 has an epitaxial relationship, i.e., same crystal orientation, as the topmost surface of the bottom cladding layer 54.

The top cladding layer 58 may comprise any semiconductor material including, for example, an IV semiconductor material and/or an III-V compound semiconductor material. In one example, the top cladding layer 58 may comprise AlGaAs. In some embodiments, the top cladding layer 58 may comprise a same semiconductor material as the bottom cladding layer 54. In another embodiment, the top cladding layer 58 may comprise a different semiconductor material than the bottom cladding layer 54. In some embodiments, the semiconductor material that provides the top cladding layer 58 may be of a second conductivity type that is opposite from that of first conductivity type. The semiconductor material that provides the top cladding layer 58 can be formed utilizing an epitaxial growth (or deposition) process. Since an epitaxial growth process is used in forming the semiconductor material that provides the top cladding layer 58, the top cladding layer 58 has an epitaxial relationship, i.e., same crystal orientation, as the topmost surface of the active layer 56. In some embodiment, the top and bottom cladding layers (54, 58) may confine electrons with the active layer 56.

A dielectric material 52 is also present within the first region 50. The dielectric material 52 surrounds the optoelectronic device (54, 56 and 58) and is present on remaining portions of the topmost surface of germanium layer 14. A portion of dielectric material 52 also contacts a surface of insulator layer portion 12P as well as any exposed sidewall surfaces of the germanium layer 14. The dielectric material 52 may comprise any dielectric material including, for example, oxides, nitrides or oxynitrides. In one embodiment, dielectric material 52 comprises a same dielectric material as insulator layer portion 12P. In one example, silicon dioxide is used as the material for dielectric material 52 and insulator layer portion 12P. In another embodiment, dielectric material 52 comprises a different dielectric material than insulator layer portion 12P. In one example, silicon nitride or boron nitride is used as the dielectric material for insulator layer portion 12P, while silicon dioxide is used as dielectric material 52. Dielectric material 52 can be formed utilizing any deposition process including, but not limited to, chemical vapor deposition, plasma chemical vapor deposition or physical vapor deposition. The dielectric material 52 that is formed has a thickness, i.e., height, which extends above the topmost surface of the optoelectronic device (54, 56, 58).

Dielectric material 52 also embeds a top contact (60, 62) that is made to the topmost surface of the optoelectronic device (54, 56, 58); the top contact (60, 62) within the first region 50 can be referred to as an optoelectronic top contact. The top contact (60, 62) may include an optional metal semiconductor alloy layer 60 and a conductive metal structure 62. The optional metal semiconductor alloy layer 60 is composed of a reaction product of a metal semiconductor alloy forming metal such as, for example, Ni, Co, W or Pt, and a semiconductor material. The semiconductor material may comprise a topmost surface of the top cladding layer 58, or a semiconductor material that is subsequently formed on a portion of the top cladding layer 58. In one example, silicon is used and a metal silicide can be formed as metal semiconductor alloy layer 60. The conductive metal structure 62 is comprised of any conductive metal including, for example, W, Ag, Au, Al, Cu or alloys thereof.

The top contact (60, 62) can be formed by providing a contact opening within dielectric material 52. The contact opening can be formed by lithography and etching. In one embodiment, the etch is an anisotropic etch such as, for example, reactive ion etching. After providing the contact opening, the metal semiconductor alloy 60 can be formed. In one embodiment, the metal semiconductor alloy 60 can be formed by depositing a metal semiconductor alloy forming metal, annealing and subsequently removing any non-reactant metal semiconductor alloy forming metal. The metal semiconductor alloy forming metal can be formed by a deposition process such as, for example, atomic layer deposition, chemical vapor deposition, physical vapor deposition, sputtering, or plating. The anneal may include a single anneal or multiple anneals may be performed. The anneal is performed at a temperature that causes metal diffusion and subsequent reaction with a semiconductor material. In one example, the anneal is performed at a temperature of 500° C. or greater. The non-reacted portion of the metal semiconductor alloy forming metal can be removed utilizing an etching process that is selective in removing metal. In some embodiments, and prior to forming the metal semiconductor alloy forming metal, a semiconductor material can be formed within the contact opening by an epitaxial growth process directly on an exposed surface of the topmost layer of the optoelectronic device (54, 56, 58). Conductive metal structure 62 is then formed either directly on a topmost surface of the metal semiconductor alloy 60 or directly on an exposed portion of the topmost surface of the optoelectronic device (54, 56, 58). The conductive metal structure 62 can be formed by depositing one of the above mentioned conductive metals and, if needed, a planarization process can be subsequently performed.

The second region 100 includes an epitaxially grown semiconductor material 102 that is formed directly on an exposed surface of substrate 10L. The epitaxially grown semiconductor material 102 may include one of the semiconductor materials mentioned above for substrate 10L. In one embodiment, the semiconductor material that provides the epitaxially grown semiconductor material 102 and substrate 10L comprise a same semiconductor material. In one example, the semiconductor material that provides the epitaxially grown semiconductor material 102 and substrate 10L comprise silicon. In another embodiment, the semiconductor material that provides the epitaxially grown semiconductor material 102 is different from the semiconductor material that provides substrate 10L. In one example, the semiconductor material that provides the epitaxially grown semiconductor material 102 comprises a silicon germanium alloy, while substrate 10L comprises silicon. Since an epitaxial growth process is used in forming the semiconductor material that provides the epitaxially grown semiconductor material 102, the epitaxially grown semiconductor material 102 has an epitaxial relationship, i.e., same crystal orientation, as the topmost surface of the substrate 10L.

The second region 100 further includes a plurality of CMOS devices 104 located on the epitaxtially grown semiconductor material layer 102. In some embodiments, the plurality of CMOS devices 104 are field effect transistors that can be made utilizing a gate first or a gate last process flow as are well known to those skilled in the art. The transistors may include a gate dielectric portion (not shown) and an overlaying gate conductor portion (also not shown). The gate dielectric material that provides each gate dielectric portion can be an oxide, nitride, and/or oxynitride. In one example, the gate dielectric material that provides each gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion.

The gate dielectric material used in providing each gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion. In some embodiments, each gate dielectric portion comprises a same gate dielectric material. In other embodiments, some gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing each gate dielectric portion can have a thickness in a range from 1 nm to 10 nm. Other thicknesses that are lesser than, or greater than, the aforementioned thickness range can also be employed for the gate dielectric material.

Each gate conductor portion comprises a gate conductor material. The gate conductor material used in providing each gate conductor portion can include any conductive material including, for example, doped polysilicon, an elemental metal (e.g., tungsten, titanium, tantalum, aluminum, nickel, ruthenium, palladium or platinum), an alloy of at least two elemental metals, an elemental metal nitride (e.g., tungsten nitride, aluminum nitride, or titanium nitride), an elemental metal silicide (e.g., tungsten silicide, nickel silicide, or titanium silicide) or multilayered combinations thereof. In some embodiments, each gate conductor portion may comprise an nFET gate metal. In other embodiments, each gate conductor portion may comprise a pFET gate metal. In yet other embodiments, some gate conductor portions comprise an nFET gate metal, while other gate dielectric portions comprise a pFET gate metal.

The gate conductor material used in providing each gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing each gate conductor portion has a thickness from 1 nm to 100 nm. Other thicknesses that are lesser than, or greater than, the aforementioned thickness range can also be employed for the gate conductor material used in providing each gate conductor portion.

Each transistor may also include a gate dielectric spacer and source/drain regions. The gate dielectric spacers may comprise any dielectric material and can be formed by deposition and etching. The gate dielectric spacer surrounds an individual transistor that includes a gate stack of a gate dielectric portion and a gate conductor portion. The source/drain regions can be formed by introducing a p-type or n-type dopant into the epitaxially grown semiconductor material by ion implantation or gas phase doping.

In some embodiments (not shown), the epitaxially grown semiconductor material 102 can be processed to include one or more semiconductor fins or semiconductor nanowires. The semiconductor fins or nanowires can be formed by patterning the epitaxially grown semiconductor material 102 by lithography and etching or a sidewall image transfer process as known to those in the art can be used.

A dielectric material 106 can be present in the second region 100. The dielectric material 106 surrounds each CMOS device 104 and contacts a portion of the underlying epitaxially grown semiconductor material 102. Dielectric material 106 also contacts a sidewall surface of dielectric material 52. Dielectric material 106 may comprise one of the dielectric materials mentioned above for dielectric material 52. In some embodiments, dielectric material 106 and dielectric material 52 comprise a same dielectric material. For example, dielectric material 106 and dielectric material 52 may both comprise silicon dioxide. In other embodiments, dielectric material 106 may comprise a different dielectric material than dielectric material 52. For example, dielectric material 106 may comprise silicon nitride, while dielectric material 52 may comprise silicon dioxide. Dielectric material 106 can be formed utilizing one of the deposition processes mentioned above in forming dielectric material 52. In some embodiments, dielectric material 106 and dielectric material 52 are formed simultaneously utilizing the same deposition process.

Dielectric material 106 also includes top contacts that contact a portion of each CMOS device 104; in the second area the top contacts can be referred to as CMOS top contacts. In this embodiment, top contacts within second region 100 comprise a conductive metal structure 108. In some embodiments (not shown) the top contacts can also include a metal semiconductor alloy formed between the conductive metal structure 108 and the CMOS device 104. The metal semiconductor alloy and conductive metal structures 108 are the same as those previous described above in first region 50.

The exemplary semiconductor structure shown in FIG. 1 can be formed by first providing a GOI substrate. The GOI substrate can then be patterned by lithography and etching to remove the insulator layer and the germanium layer of the GOI substrate from atop a portion of the substrate 10L thus forming first region 50 and second region 100. At this point of the present application, a block mask can be formed over the first region 50, and then the second region 100 can be processed to include the epitaxially grown semiconductor material layer 102, and the CMOS devices 104. After CMOS device formation, a block mask can be formed over the second region 100 and then the first region 50 can processed to include the wave guide (not shown), and the optoelectronic device (54, 56, 58). In one embodiment, the wave guide (not shown) and the optoelectronic device (54, 56, 58) can be formed by forming trenches with a lower portion of dielectric material 52 and then forming each component within the trenches. After forming the wave guide and optoelectronic device (54, 56, 58), additional dielectric material can be deposited (with or without the block mask over second region 100) to complete the formation of dielectric material 52. The additional dielectric material can form dielectric material 106 within the second device region if the block mask is removed over the second device region 100 prior to the deposition of the additional dielectric material. In some embodiments, the additional dielectric material is formed, the block mask is removed over second region 100, and then dielectric material 106 is formed. The top contacts within the first region 50 and second region 100 can be formed at the same time or different times. A greater discussion of forming the structure shown in FIG. 1 can be found in Applicant's co-pending U.S. application Ser. No. 14/661,037, filed on Mar. 18, 2015, the entire content of which is incorporated herein by reference.

Figure 2:
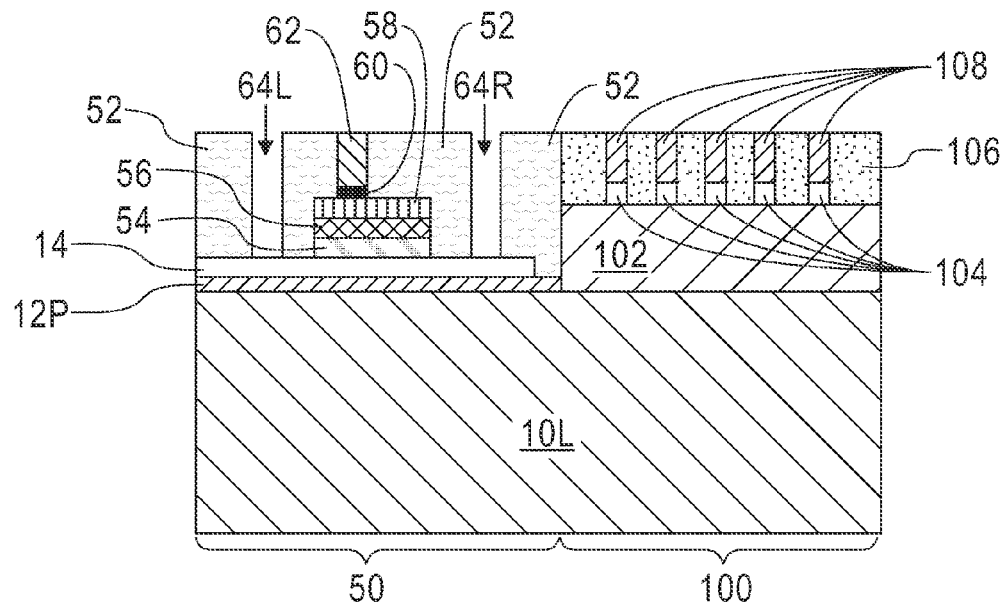
FIG. 2 is a cross sectional view of the exemplary semiconductor structure of FIG. 1 after forming a pair of openings in a dielectric material that is located adjacent and atop the optoelectronic device and which extend to a topmost surface of the germanium layer.

Referring now to FIG. 2, there is illustrated the exemplary semiconductor structure of FIG. 1 after forming a pair of openings 64L, 64R within a portion of dielectric material 52. As is illustrated, each opening 64L, 64R extends to a topmost surface of the germanium layer 14. Each opening 64L, 65R can be formed by lithography and etching. The etching may include an anisotropic etch such as, for example, a reactive ion etch.

Figure 3:
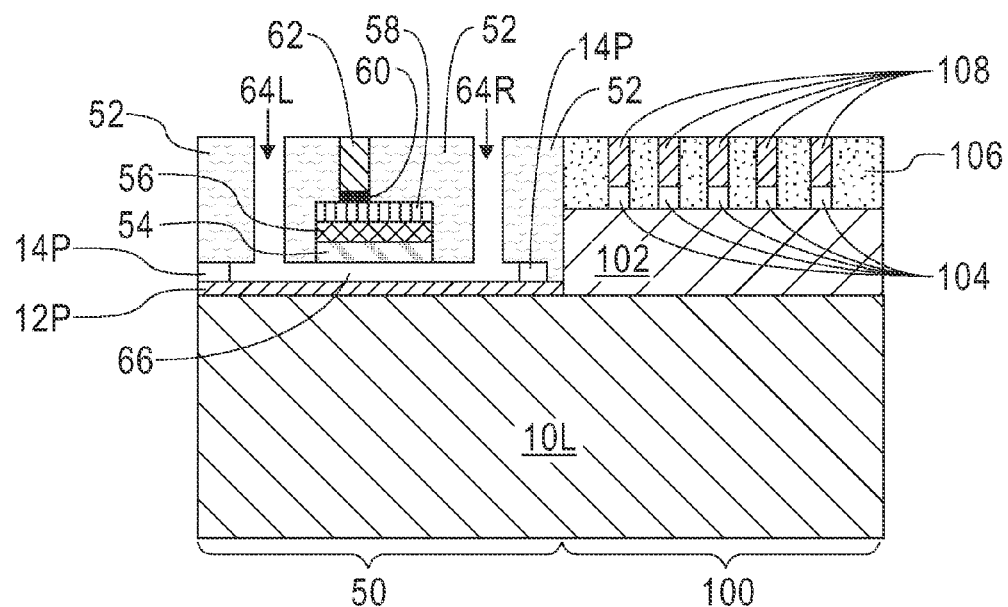
FIG. 3 is a cross sectional view of the exemplary semiconductor structure of FIG. 2 after removing the germanium layer that is located beneath the optoelectronic device to provide an air gap.

Referring now to FIG. 3, there is illustrated the exemplary semiconductor structure of FIG. 2 after removing the germanium layer 14 that is located beneath the optoelectronic device (54, 56, 58) to provide an air gap 66. The air gap 66 can be formed utilizing an isotropic etching process that can selectively remove portions of the germanium layer 14. In one example, the isotropic etch used to remove portions of the germanium layer 14 may include $XeF_2$. The air gap 66 has a length that is greater than a length from an outer sidewall of first opening 64L to the outer sidewall of second opening 64R since some germanium that lies to the left of the first opening 64L and to the right of the second opening 64R is also removed. Each remaining portion of the germanium layer is referred to herein as germanium portion 14P. The air gap 66 that is directly beneath the optoelectronic device has a topmost surface that exposes a bottommost surface of the optoelectronic device (54, 56, 58); in the illustrated embodiment, the topmost surface of the air gap 66 directly beneath the optoelectronic structure exposes a bottommost surface of the bottom cladding layer 54. The air gap 66 has a bottommost surface that exposes a topmost surface of the insulator layer portion 12P.

Figure 4:
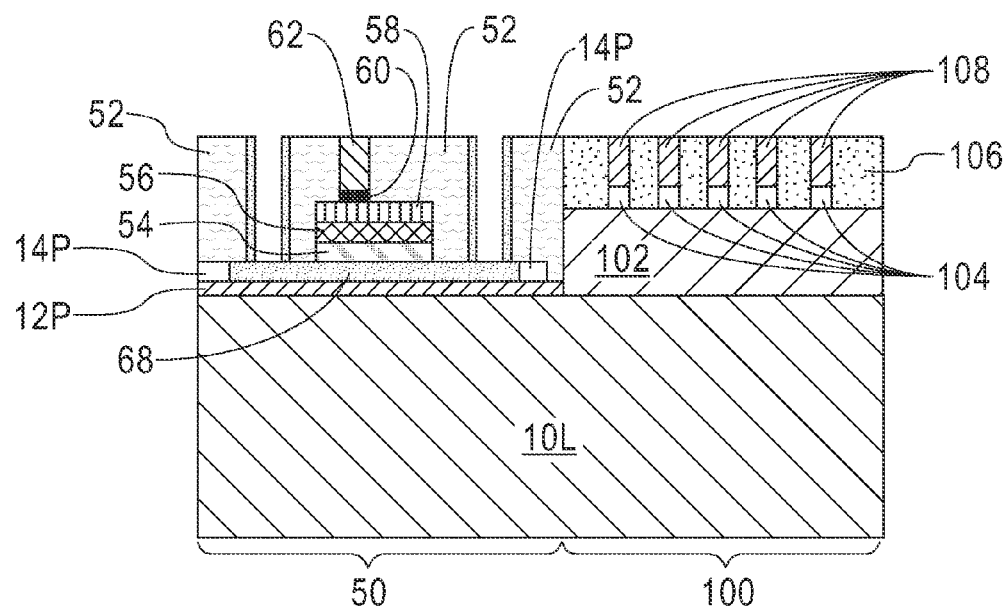
FIG. 4 is a cross sectional view of the exemplary semiconductor structure of FIG. 3 after forming a bottom metal contact within the air gap and along sidewalls of each of the openings.

Referring now to FIG. 4, there is illustrated the exemplary semiconductor structure of FIG. 3 after forming a bottom metal contact 68 within the air gap 66 and along sidewalls of each of the openings 64L, 64R. The bottom metal contact 68 completely fills the air gap 66 and, in some embodiments, partially fills each opening 64L, 64R. In some embodiments (not shown), the bottom metal contact 68 can completely fill each opening 64L, 64R. As is shown in FIG. 4, a sidewall surface of each germanium portion 14P contacts a portion of said bottom metal contact 68.

The bottom metal contact 68 may include any conductive metal containing material including, for example, a conductive metal (e.g., tungsten, titanium, tantalum, aluminum, nickel, ruthenium, palladium or platinum), an alloy of at least two conductive metals, and/or a conductive metal nitride (e.g., tungsten nitride, aluminum nitride, or titanium nitride). The conductive metal containing material that provides the bottom metal contact 68 may be formed by a deposition process including for example, atomic layer deposition, chemical vapor deposition, plasma enhanced chemical vapor deposition, or gas phase deposition. In some embodiments, a planarization process may follow the deposition of the conductive metal containing material that provides the bottom metal contact 68. In accordance with the present application, a portion of the bottom metal contact 68 contacts an entire bottommost surface of the optoelectronic device (54, 56, 58).

Figure 5:
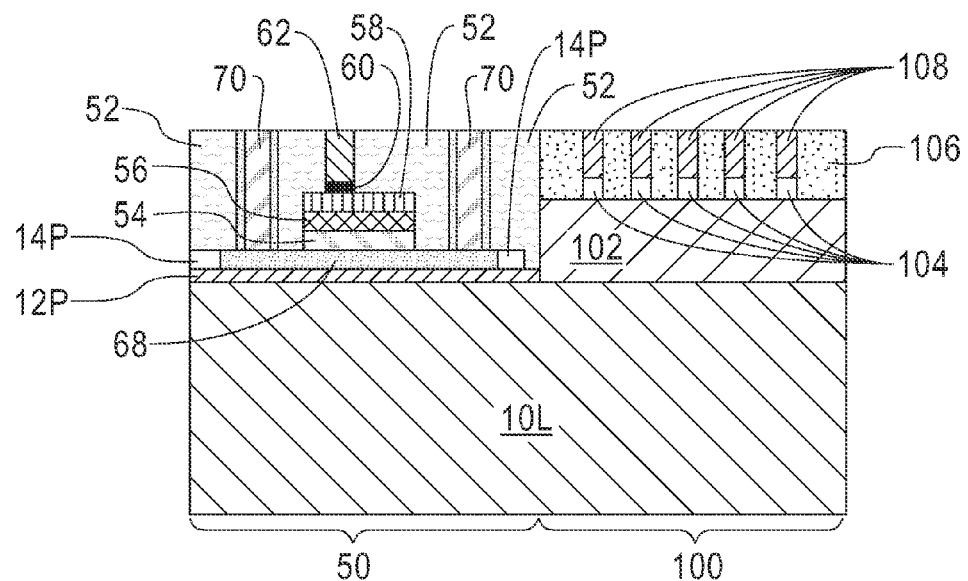
FIG. 5 is a cross sectional view of the exemplary semiconductor structure of FIG. 4 after filling the remaining volume of each of the openings with an interconnect metal structure.

Referring now to FIG. 5, there is illustrated the exemplary semiconductor structure of FIG. 4 after filling the remaining volume of each of the openings 64L, 64R with an interconnect metal structure 70. In one embodiment, the interconnect metal structure 70 may comprise a conductive metal that may be the same as the conductive metal that provides the bottom metal contact 68. In another embodiment, the interconnect metal structure 70 may comprise a conductive metal that may be different from the conductive metal that provides the bottom metal contact 68. In one embodiment, the interconnect metal structure 70 includes W, Ag, Au, Al, Cu or alloys thereof. The conductive metal that provides the interconnect conductive structure 70 may be formed by a deposition process including for example, atomic layer deposition, chemical vapor deposition, plasma enhanced chemical vapor deposition of electroplating. In some embodiments, a planarization process may follow the deposition of the conductive metal that provides the interconnect metal structure 70. As is shown, the bottom metal contact 68 that is present along the sidewalls of each opening 64L, 64R has a topmost surface that is coplanar with a topmost surface of the interconnect metal structure 70. These topmost surfaces in turn are coplanar with a topmost surface of dielectric material 52.

In embodiments when multiple optoelectronic devices are formed, each optoelectronic device will include its own bottom metal contact in which the bottom metal contacts are isolated from each other by providing an isolation structure between the bottom metal contacts. In such an embodiment, the process described above can be modified to form isolation structures utilizing trench isolation techniques that are well known to those skilled in the art. The isolation structures would isolate the germanium portions 14P; in the embodiments that follow more than one optoelectronic device can be formed and processed to include isolation structures.

Figure 6:
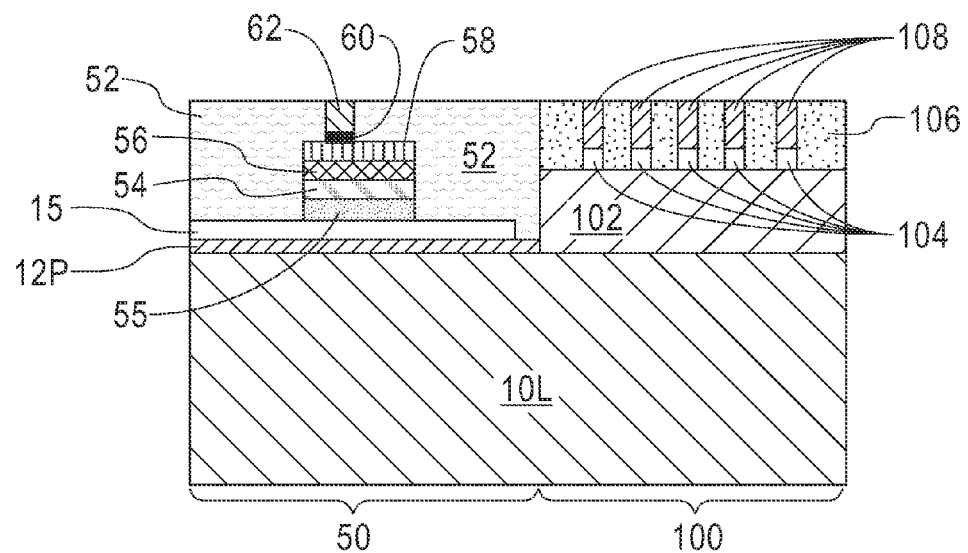
FIG. 6 is a cross sectional view of an exemplary semiconductor structure including an optoelectronic device located on a germanium buffer layer and in a first region of a substrate, and complementary metal oxide semiconductor (CMOS) devices located on an epitaxtially grown semiconductor material layer and in a second region of the substrate, a top contact is made to the optoelectronic device and each CMOS device.

Referring now to FIG. 6, there is illustrated an exemplary semiconductor structure including an optoelectronic device (54, 56, 58) located on a germanium buffer layer 55 and in a first region 50 of a substrate 10L, and complementary metal oxide semiconductor (CMOS) devices 104 located on an epitaxially grown semiconductor material layer 102 and in a second region 100 of the substrate 10L, a top contact (62, 108) is made to the optoelectronic device (54, 56, 58) and each CMOS device 104. A wave guide (not shown) can be processed within dielectric material 52 and contacting a sidewall surface of the active layer 56. The exemplary structure shown in FIG. 6 is similar to (i.e., contains the same elements as) the exemplary semiconductor structure shown in FIG. 1 except that the germanium layer 14 of the exemplary structure shown in FIG. 1 is replaced by a silicon layer 15 and germanium buffer layer 55 is formed on a portion of the silicon layer 15. In this embodiment, the substrate 10L is a handle substrate of a silicon-on-insulator (SOI) substrate.

Thus, and in this embodiment, a silicon-on-insulator (SOI) substrate is employed instead of a GOI substrate as was the case in providing the exemplary semiconductor structure shown in FIG. 1. In some embodiments, silicon layer 15 may be pure silicon or silicon that is alloyed with germanium and/or carbon. The SOI substrate that can be used in this embodiment can be formed by Separation by Ion Implantation of Oxygen (SIMOX) or by wafer bonding.

The exemplary semiconductor structure shown in FIG. 6 can be formed utilizing the various materials and processing steps mentioned above in providing the structure shown in FIG. 1. The germanium buffer layer 55 can be formed utilizing an epitaxial growth process. Thus, the germanium buffer layer 55 has an epitaxial relationship with the underlying growth surface of the silicon layer 15. The germanium buffer layer 55 may have a uniform germanium content or a graded germanium content may be used. The germanium buffer layer 55 may have sidewall surfaces that are vertical aligned to the sidewall surfaces of the optoelectronic device (54, 56, 58). In the illustrated embodiment, the bottom cladding layer 54 of the optoelectronic device has an epitaxial relationship with the topmost surface of the germanium buffer layer 55. The germanium buffer layer 55 may have a thickness from 1 nm to 1000 nm. Other thicknesses that are lesser than, or greater than, the aforementioned thickness range can also be employed as the thickness of the germanium buffer layer.

Figure 7:
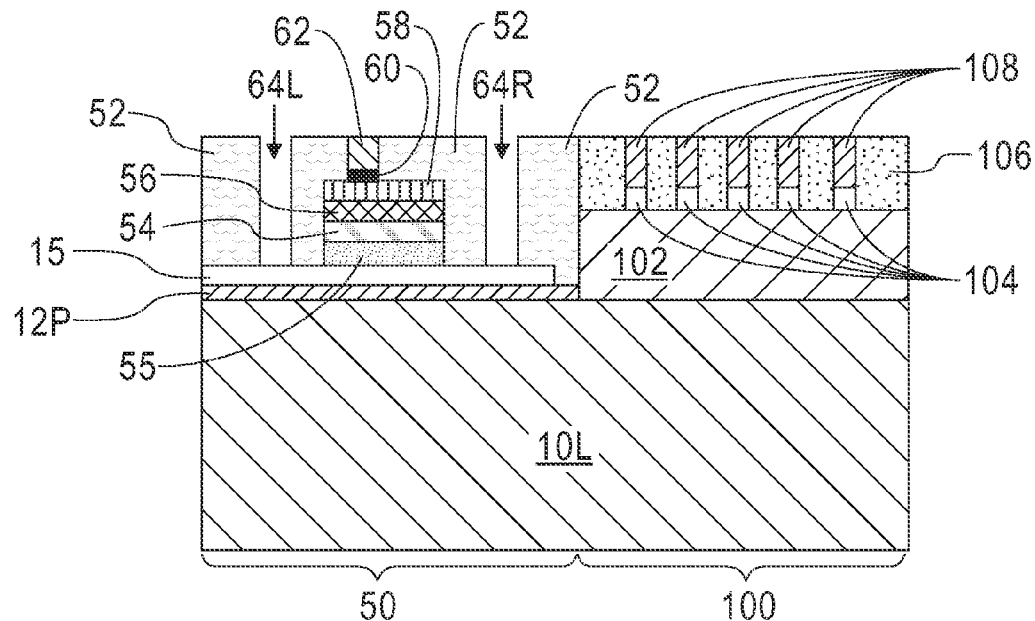
FIG. 7 is a cross sectional view of the exemplary semiconductor structure of FIG. 6 after forming a pair of openings in a dielectric material that is located adjacent and atop the optoelectronic device and which extend to a topmost surface of a silicon layer that is located beneath the germanium buffer layer.

Referring now to FIG. 7, there is illustrated the exemplary semiconductor structure of FIG. 6 after forming a pair of openings 64L, 64R in the dielectric material 52 that is located adjacent and atop the optoelectronic device (54, 56 and 58) and which extend to a topmost surface of a silicon layer 15 that is located beneath the germanium buffer layer 55. The pair of openings 64L, 64R can be formed as described above in providing the pair of openings 64L, 64R in the exemplary semiconductor structure shown in FIG. 2.

Figure 8:
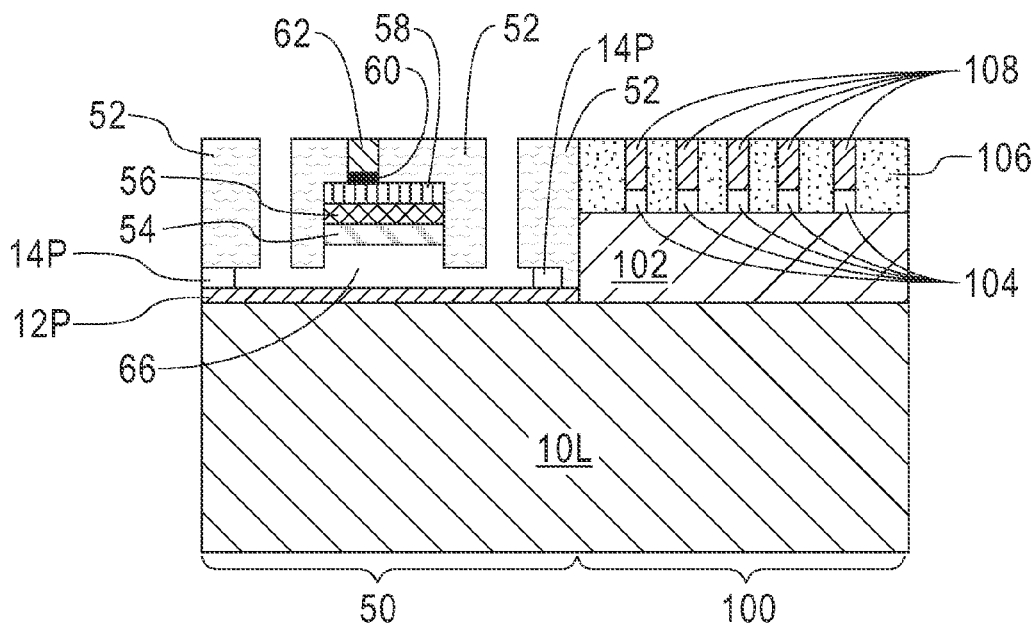
FIG. 8 is a cross sectional view of the exemplary semiconductor structure of FIG. 7 after removing the silicon layer and the germanium buffer layer that are located beneath the optoelectronic device to provide an air gap.

Referring now to FIG. 8, there is illustrated the exemplary semiconductor structure of FIG. 7 after removing the silicon layer 15 and the germanium buffer layer 55 that are located beneath the optoelectronic device (54, 56, 58) to provide an air gap 66; in this embodiment, the air gap 66 that is located directly beneath the optoelectronic device (54, 56, 58) has an upper portion that is confined at the ends by portions of dielectric material 52.

A portion of the silicon layer 14 to the left of opening 64L remains, while another portion of the silicon layer 14 to the right of opening 64R remains. Each remaining portion of silicon layer 15 can be referred to herein as a silicon layer portion 15P. The air gap 66 can be formed utilizing one or more etching isotropic processes. In one example, the isotropic etch used to remove portions of the silicon layer 15 and the germanium buffer layer 55 includes $XeF_2$.

The air gap 66 has a length that is greater than a length from an outer sidewall of first opening 64L to the outer sidewall of second opening 64R since some silicon lies to the left on the first opening 64L and to the right of the second opening 64R is also removed. The air gap 66 that is directly beneath the optoelectronic device has a topmost surface that exposes a bottommost surface of the optoelectronic device (54, 56, 58); in the illustrated embodiment, the topmost surface of the air gap 66 directly beneath the optoelectronic structure exposes a bottommost surface of the bottom cladding layer 54. The air gap 66 has a bottommost surface that exposes a topmost surface of the insulator layer portion 12P.

Figure 9:
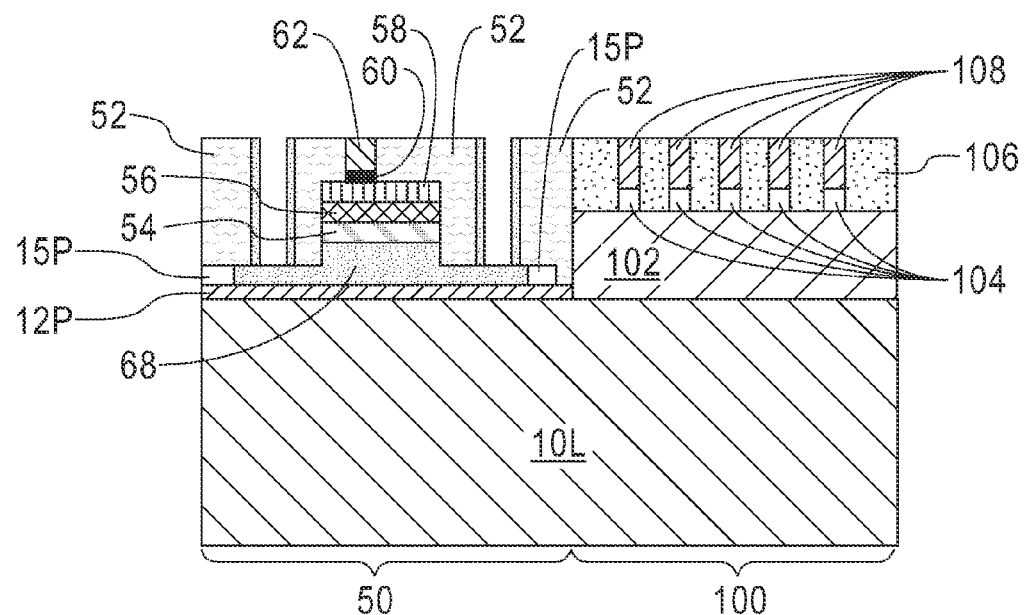
FIG. 9 is a cross sectional view of the exemplary semiconductor structure of FIG. 8 after forming a bottom metal contact within the air gap and along sidewalls of each of the openings.

Referring now to FIG. 9, there is illustrated the exemplary semiconductor structure of FIG. 8 after forming a bottom metal contact 68 within the air gap 66 and along sidewalls of each of the openings 64L, 64R. The bottom metal contact 68 completely fills the air gap 66 and, in some embodiments, partially fills each opening 64L, 64R. In some embodiments (not shown), the bottom metal contact 68 can completely fill each opening 64L, 64R. The bottom metal contact 68 that is used in this embodiment is the same as that described above in the previous embodiment of the present application that provides the same to the exemplary semiconductor structure shown in FIG. 4. As is shown in FIG. 9, a sidewall surface of each silicon portion 15P contacts a portion of said bottom metal contact 68.

Figure 10:
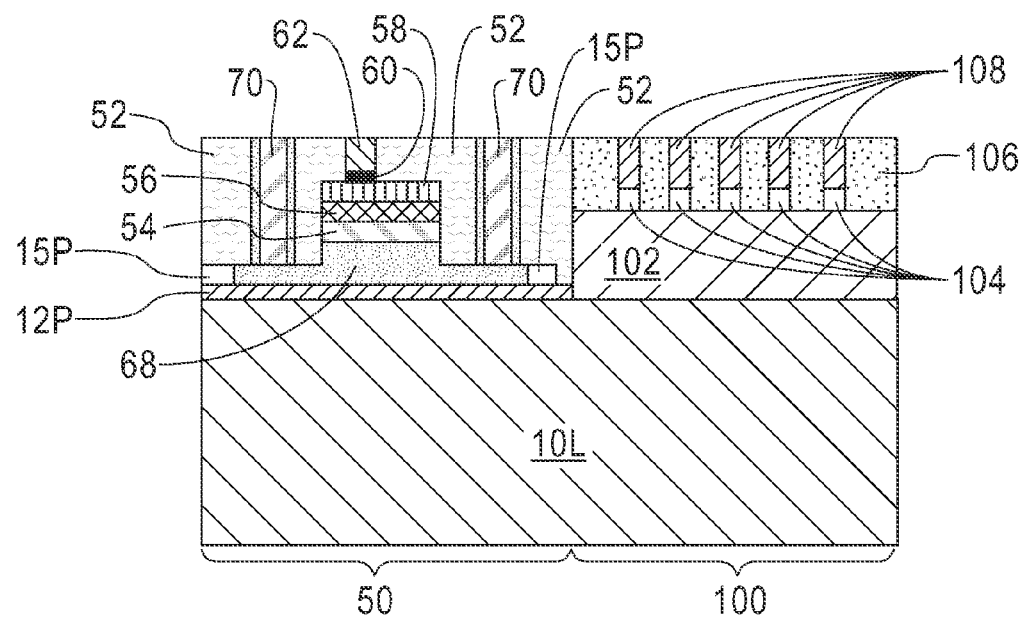
FIG. 10 is a cross sectional view of the exemplary semiconductor structure of FIG. 9 after filling the remaining volume of each of the openings with an interconnect metal structure.

Referring now to FIG. 10, there is illustrated the exemplary semiconductor structure of FIG. 9 after filling the remaining volume of each of the openings 64L, 64R with an interconnect metal structure 70. The interconnect metal structure 70 that is used in this embodiment is the same as that described above in the previous embodiment of the present application that provides the same to the exemplary semiconductor structure shown in FIG. 5.

Figure 11:
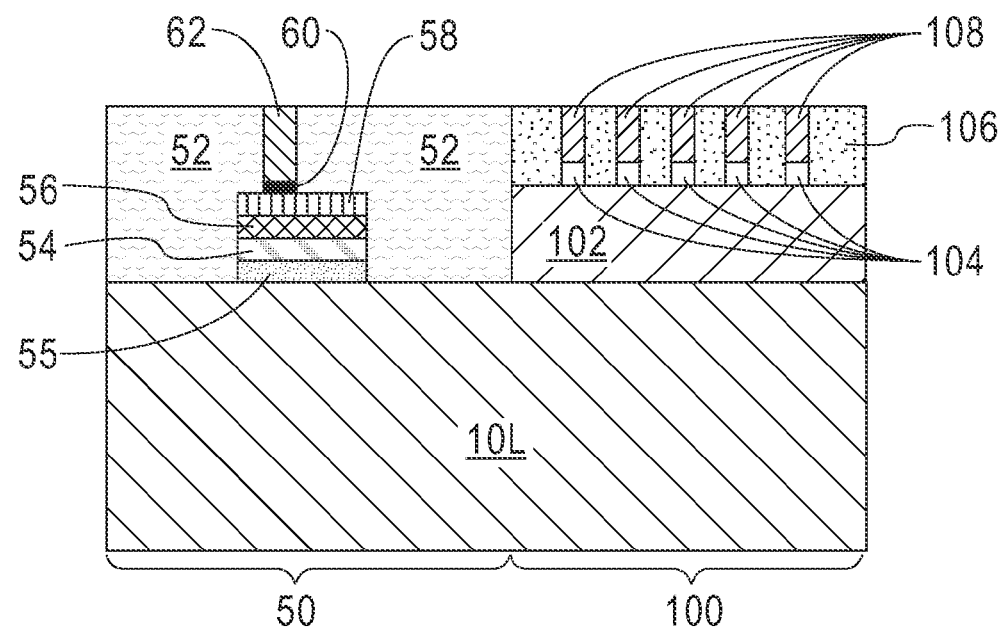
FIG. 11 is a cross sectional view of an exemplary semiconductor structure including an optoelectronic device located on a germanium buffer layer and in a first region of a substrate, and complementary metal oxide semiconductor (CMOS) devices located on an epitaxtially grown semiconductor material layer and in a second region of the substrate, a top contact is made to the optoelectronic device and each CMOS device.

Referring now to FIG. 11, there is illustrated an exemplary semiconductor structure including an optoelectronic device (54, 56, 58) located on a germanium buffer layer 55 and in a first region 50 of a substrate 10L, and complementary metal oxide semiconductor (CMOS) devices 104 located on an epitaxially grown semiconductor material layer 102 and in a second region 100 of the substrate 10L, a top contact (62, 108) is made to the optoelectronic device (54, 56, 58) and each CMOS device (104). The exemplary semiconductor structure shown in this embodiment is similar to (i.e., contains the same elements as) the exemplary semiconductor structure shown in FIG. 6 except that no insulator layer portion 12P or silicon layer 15 is employed. In this embodiment, the substrate 10L is a bulk semiconductor substrate. By "bulk" it is meant that the entire semiconductor substrate is composed of one or more semiconductor materials; hence a bulk substrate does not include an insulator layer and an overlying top semiconductor layer as the case of an SOI substrate. In one embodiment, the substrate 10L is comprised of a silicon containing semiconductor material (i.e., pure silicon, or silicon that is alloyed with one of germanium and/or carbon).

Figure 12:
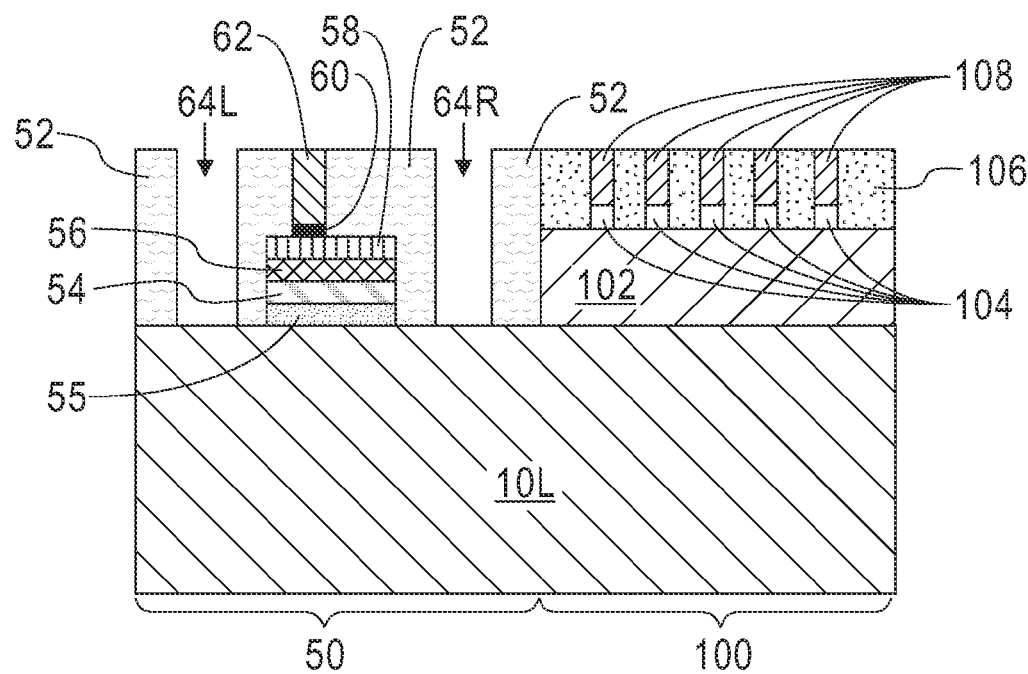
FIG. 12 is a cross sectional view of the exemplary semiconductor structure of FIG. 11 after forming a pair of openings in a dielectric material that is located adjacent and atop the optoelectronic device and which extend to a topmost surface of a bulk semiconductor material of the substrate that is within the first region.

Referring now to FIG. 12, there is illustrated the exemplary semiconductor structure of FIG. 11 after forming a pair of openings 64L, 64R in a dielectric material 52 that is located adjacent and atop the optoelectronic device (54, 56, 58) and which extend to a topmost surface of a bulk semiconductor material of the substrate 10L within first region 50. The pair of openings 64L, 64R can be formed as described above in providing the pair of openings 64L, 64R in the exemplary semiconductor structure shown in FIG. 2.

Figure 13:
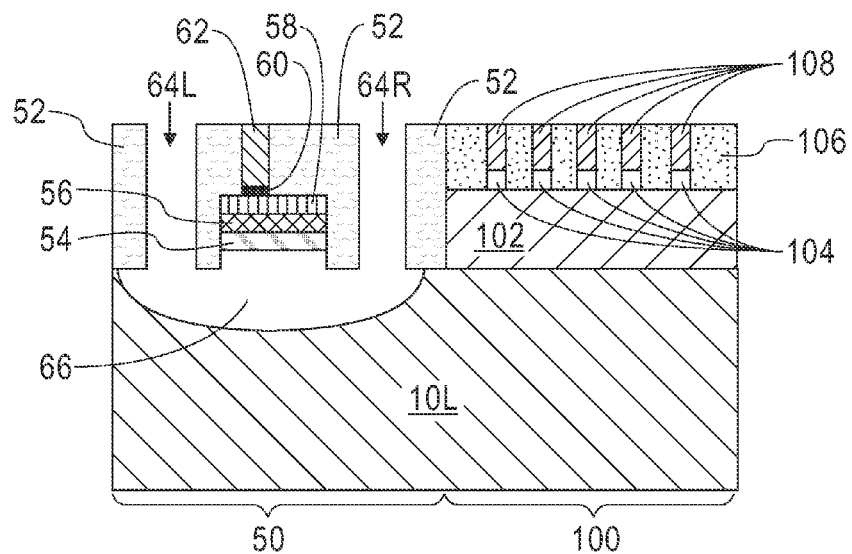
FIG. 13 is a cross sectional view of the exemplary semiconductor structure of FIG. 12 after removing an upper portion of the bulk semiconductor material and the germanium buffer layer that are located beneath the optoelectronic device to provide an air gap.

Referring now to FIG. 13, there is illustrated the exemplary semiconductor structure of FIG. 12 after removing an upper portion of the bulk semiconductor material and the germanium buffer layer 55 that are located beneath the optoelectronic device (54, 56, 58) to provide an air gap 66; in this embodiment, the air gap 66 that is located directly beneath the optoelectronic device (54, 56, 58) has an upper portion that is confined at the ends by portions of dielectric material 52. Also, and unlike the previous embodiments in which the bottommost surface of the air gap 66 was confined by the insulator layer portion 12P, the bottommost surface of the air gap 66 is non-planar and extends into the substrate 10L.

The air gap 66 can be formed utilizing one or more isotropic etching processes. In one example, the isotropic etch used to remove an upper portion of the bulk semiconductor material and the germanium buffer layer 55 may include $XeF_2$.

The air gap 66 that is directly beneath the optoelectronic device has a topmost surface that exposes a bottommost surface of the optoelectronic device (54, 56, 58); in the illustrated embodiment, the topmost surface of the air gap 66 directly beneath the optoelectronic structure exposes a bottommost surface of the bottom cladding layer 54.

Figure 14:
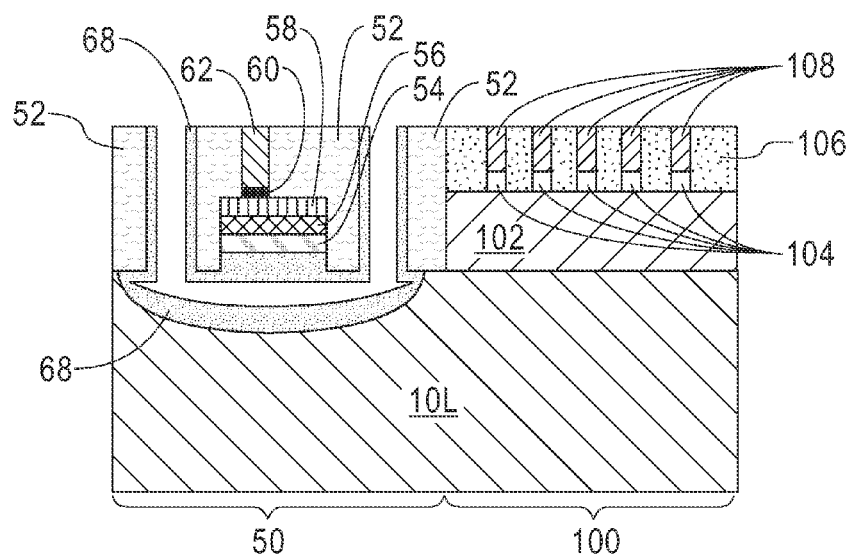
FIG. 14 is a cross sectional view of the exemplary semiconductor structure of FIG. 13 after forming a bottom metal contact along sidewalls of the air gap and along sidewalls of each of the openings.

Referring to FIG. 14, there is illustrated the exemplary semiconductor structure of FIG. 13 after forming a bottom metal contact 68 along sidewalls of the air gap 66 and along sidewalls of each of the openings 64L, 64R. In this embodiment, the bottom metal contact 68 may or may not completely fill the air gap 66. Also, and in this embodiment, the bottom metal contact 68 may completely or partially fill each opening 64L, 64R. The bottom metal contact 68 that is used in this embodiment is the same as that described above in the previous embodiment of the present application that provides the same to the exemplary semiconductor structure shown in FIG. 4.

Figure 15:
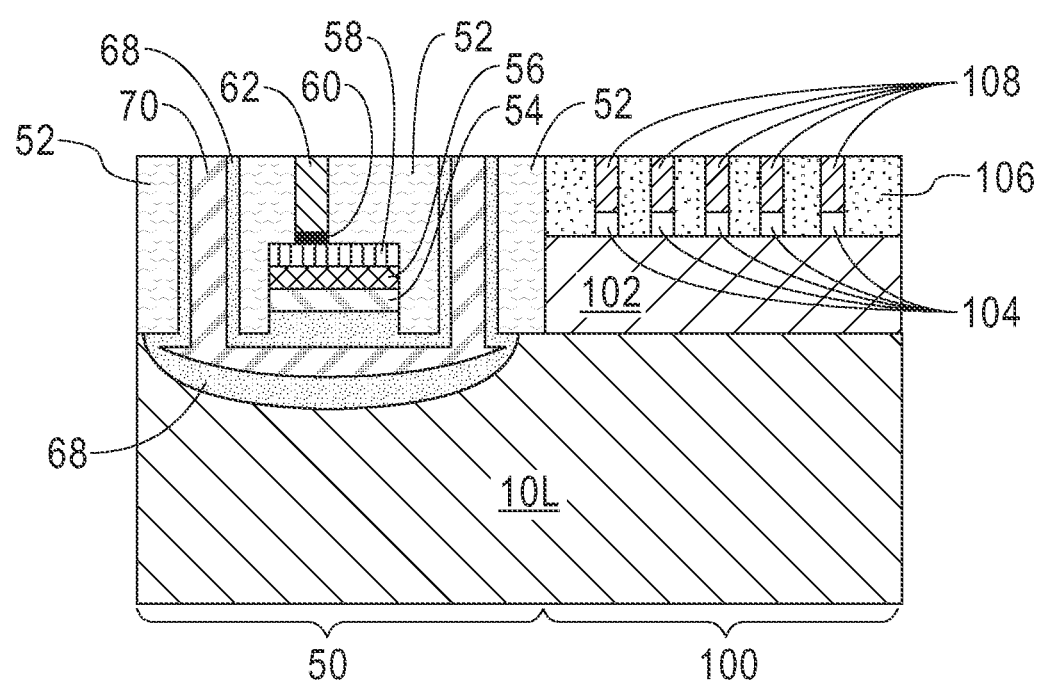
FIG. 15 is a cross sectional view of the exemplary semiconductor structure of FIG. 14 after filling the remaining volume of the air gap and each of the openings with an interconnect metal structure.

Referring now to FIG. 15, there is illustrated the exemplary semiconductor structure of FIG. 9 after filling the remaining volume of the air gap 66 and each of the openings 64L, 64R with an interconnect metal structure 70. The interconnect metal structure 70 that is used in this embodiment is the same as that described above in the previous embodiment of the present application that provides the same to the exemplary semiconductor structure shown in FIG. 5.

In the various embodiments of the present application, a back contact 68 is provided to the optoelectronic device (54, 56, 58). In some embodiments, back contacts 68 can provide uniform current injection (for lasers, LEDs and modulators), better heat sinking (for lasers, and LEDs), low series resistance (for lasers, LEDs and photodetectors) and/or a bottom mirror for light reflection (for LEDs).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    an optoelectronic device located in one region of a substrate;
    a dielectric material located adjacent and atop said optoelectronic device;
    a top contact located within a region of said dielectric material and contacting a topmost surface of said optoelectronic device;
    a bottom metal contact located beneath said optoelectronic device and lining a pair of openings located within other regions of said dielectric material, wherein a portion of said bottom metal contact contacts an entire bottommost surface of said optoelectronic device, and wherein another portion of said bottom metal contact directly contacts a portion of a topmost surface of an insulator layer, said insulator layer is located on a topmost surface of said substrate in said one region; and
    germanium portions contacting other portions of said topmost surface of said insulating layer, wherein said germanium portions have a sidewall surface that contacts a portion of said bottom metal contact.

2. The semiconductor structure of claim 1, wherein said germanium portions have a topmost surface that contacts a portion of said dielectric material.

3. The semiconductor structure of claim 2, wherein a remaining volume of each opening contains an interconnect metal structure.

4. The semiconductor structure of claim 1, wherein said substrate is a bulk semiconductor substrate, and wherein said bottom metal contact extends beneath a topmost surface of said bulk semiconductor substrate.

5. The semiconductor structure of claim 4, wherein a remaining volume of each opening contains an interconnect metal structure, and wherein a portion of said interconnect metal structure is located beneath said optoelectronic device and is surrounded by said bottom metal contact.

6. The semiconductor structure of claim 1, further comprising an epitaxially grown semiconductor material located in a second region of said substrate, wherein a plurality of complementary metal oxide semiconductor devices are located upon said epitaxially grown semiconductor material, and wherein top contacts are located within another dielectric material and contacting a topmost surface of each complementary metal oxide semiconductor device.

7. A semiconductor structure comprising:
    an optoelectronic device located in one region of a substrate;
    a dielectric material located adjacent and atop said optoelectronic device;
    a top contact located within a region of said dielectric material and contacting a topmost surface of said optoelectronic device;
    a bottom metal contact located beneath said optoelectronic device and lining a pair of openings located within other regions of said dielectric material, wherein a portion of said bottom metal contact contacts an entire bottommost surface of said optoelectronic device, and wherein another portion of said bottom metal contact directly contacts a portion of a topmost surface of an insulator layer, said insulator layer is located on a topmost surface of said substrate in said one region; and
    silicon portions contacting other portions of said topmost surface of said insulating layer, wherein said silicon portions have a sidewall surface that contacts a portion of said bottom metal contact.

8. The semiconductor structure of claim 7, wherein said silicon portions have a topmost surface that contacts a portion of said dielectric material.

9. The semiconductor structure of claim 8, wherein a remaining volume of each opening contains an interconnect metal structure.

10. The semiconductor structure of claim 7, wherein said substrate is a bulk semiconductor substrate, and wherein said bottom metal contact extends beneath a topmost surface of said bulk semiconductor substrate.

11. The semiconductor structure of claim 10, wherein a remaining volume of each opening contains an interconnect metal structure, and wherein a portion of said interconnect metal structure is located beneath said optoelectronic device and is surrounded by said bottom metal contact.

12. The semiconductor structure of claim 7, further comprising an epitaxially grown semiconductor material located in a second region of said substrate, wherein a plurality of complementary metal oxide semiconductor devices are located upon said epitaxially grown semiconductor material, and wherein top contacts are located within another dielectric material and contacting a topmost surface of each complementary metal oxide semiconductor device.

* * * * *